United States Patent
Hsu et al.

(10) Patent No.: US 7,229,847 B2
(45) Date of Patent: Jun. 12, 2007

(54) FORMING ELECTRICAL CONTACTS TO A MOLECULAR LAYER

(75) Inventors: Julia Wan-Ping Hsu, Berkeley Heights, NJ (US); Yueh-Lin Loo, Princeton, NJ (US); John A. Rogers, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 690 days.

(21) Appl. No.: 10/307,642

(22) Filed: Dec. 2, 2002

(65) Prior Publication Data

US 2003/0175154 A1 Sep. 18, 2003

Related U.S. Application Data

(63) Continuation-in-part of application No. 10/178,471, filed on Jun. 24, 2002, now abandoned, and a continuation-in-part of application No. 10/098,202, filed on Mar. 15, 2002, now Pat. No. 6,946,332, and a continuation-in-part of application No. 10/098,201, filed on Mar. 15, 2002, now Pat. No. 6,596,569.

(51) Int. Cl.
H01L 51/40 (2006.01)
H01L 21/00 (2006.01)
H01L 21/84 (2006.01)

(52) U.S. Cl. .................. 438/99; 438/149; 438/738; 438/151; 438/48; 438/578; 257/E51.04; 257/E51.005; 257/E51.046

(58) Field of Classification Search .............. 438/149, 438/738, 578, 99, 48, 151; 257/E51.04, 257/E51.005, E51.046
See application file for complete search history.

(56) References Cited

U.S. PATENT DOCUMENTS

| | | | | |
|---|---|---|---|---|
| 5,512,131 A | * | 4/1996 | Kumar et al. | 438/738 |
| 5,976,284 A | * | 11/1999 | Calvert et al. | 156/51 |
| 6,033,202 A | * | 3/2000 | Bao et al. | 425/120 |
| 6,150,668 A | * | 11/2000 | Bao et al. | 257/40 |
| 6,294,401 B1 | * | 9/2001 | Jacobson et al. | 438/99 |
| 6,828,581 B2 | * | 12/2004 | Zangmeister et al. | 257/40 |
| 2002/0048531 A1 | * | 4/2002 | Fonash et al. | 422/68.1 |
| 2002/0084252 A1 | * | 7/2002 | Buchwalter et al. | 216/44 |
| 2002/0148113 A1 | * | 10/2002 | Forrest et al. | 29/847 |
| 2003/0162316 A1 | * | 8/2003 | Zangmeister et al. | 438/48 |

(Continued)

OTHER PUBLICATIONS

F. Rosei et al., Organic Molecules Acting as Templates on Metal Surfaces; Science Magazine; vol. 296, p. 328-331; Apr. 12, 2002.*

(Continued)

*Primary Examiner*—Walter Lindsay, Jr.

(57) ABSTRACT

The present invention provides a process for forming electrical contacts to a molecular layer in a nanoscale device, the nanoscale device, and a method of manufacturing an integrated circuit comprise such devices. The process includes coating a surface of a stamp with a metal layer and forming an attached layer of anchored molecules by coupling first ends of the anchored molecules to a conductive or semiconductive substrate. The process also includes placing the metal layer in contact with the attached layer of anchored molecules such that the metal layer chemically bonds to free ends of the anchored molecules. The resulting devices produced have superior reliability as compared to conventional prepared devices.

14 Claims, 6 Drawing Sheets

U.S. PATENT DOCUMENTS

2003/0235921 A1* 12/2003 Hsu et al. .................... 436/149
2004/0159633 A1* 8/2004 Whitesides et al. ........... 216/54
2005/0003590 A1* 1/2005 Blees et al. .................. 438/151
2005/0112873 A1* 5/2005 Zangmeister et al. ....... 438/678
2005/0255237 A1* 11/2005 Zhang et al. ............... 427/180

OTHER PUBLICATIONS

X.D. Cui et al., reproducible Measurement of Single-Molecule Conductivity; Science Magazine; vol. 294, p. 571-574; Oct. 19, 2001.*

* cited by examiner

FORMING ELECTRICAL CONTACTS TO A MOLECULAR LAYER

CROSS-REFERENCE TO RELATED APPLICATIONS

This application is a continuation in part of U.S. patent application Ser. No. 10/178,471, entitled "FORMING ELECTRICAL CONTACTS TO A MOLECULAR LAYER," filed on Jun. 24, 2002 now abandoned, and with U.S. patent application Ser. No. 10/098,202, filed Mar. 15, 2002 now U.S. Pat. No. 6,946,332, "FORMING NANOSCALE PATTERNED THIN FILM METAL LAYERS," and patent application Ser. No. 10/098,201, filed Mar. 15, 2002 now U.S. Pat. No. 6,596,569, "THIN FILM TRANSISTORS," all commonly assigned with the present application and incorporated herein by reference.

TECHNICAL FIELD OF THE INVENTION

The present invention is directed, in general, to forming reliable contacts in nanoscale devices. Specifically, the invention is directed to a process for forming electrical contacts to a molecular layer in a nanoscale electrical device, to the device so formed, and to a method of manufacturing an integrated circuit comprising the nanoscale device.

BACKGROUND OF THE INVENTION

There is currently great interest in the development of molecular or nanoscale electrical devices. To this end, much effort has been devoted to developing nanoscale electronic devices using organic materials including small molecules and polymers. In addition to providing higher device densities in integrated circuits, polymeric electronic devices may be more physically flexible and more cost and processing-efficient than conventional inorganic semiconductor devices.

In such nanoscale electronic devices, single molecular layers may form active elements in the device. The efficient formation of reliable electrical contacts to the molecular layer is therefore an important aspect in the commercial production of nanoscale devices. The molecules are typically fixed at one end to a conducive substrate that forms one electrical contact for the device, and to a metal layer on the other end to form a second electrical contact. Conventional processes for depositing the metal onto the molecules include treatment with a metal containing solution, to produce a colloidal metal layer, or evaporation of the metal onto the molecules, to produce an evaporated metal layer.

There may be, however, gaps between the molecules. In addition, the molecules are typically able to rotate about the first electrical contact. Both the presence of gaps, and the ability of molecules to rotate, impede the attachment of the deposited metal layer to form the second electrical contact. Some of the deposited metal, for example, goes between the gaps between molecules, resulting in an electrical short circuit between the conductive substrate and metal layer.

Furthermore, methods based on treatments with solutions of colloidal metal particles do not produce connections to all the molecules because solution-transported metal particles may attach to randomly distributed single molecules rather than to substantially all of the molecules. Methods based on the direct evaporation of metal onto the molecules are also problematic, because the high kinetic energy of the metal atoms striking the molecules may destroy or alter the structure of the molecular layer. Efforts to reduce the deleterious effects of direct evaporation, such as low temperature evaporation, or shallow angle evaporation, have not improved the production of non-defective devices to satisfactory levels. As a result, conventional processes for the deposition of the metal layer continue to produce a large number of nonfunctional devices, as indicated, for example, by the devices having an undesirably low resistance across the molecular layer. Of all devices produced in a typical conventional process, for instance, only 2% may be functional.

Therefore, previously proposed methods of attaching electrical contacts to a layer of molecules lack the desired reliability demanded by today's electronics industry. Accordingly, what is needed in the art is a method of forming such contacts, thereby increasing the efficient production of nanoscale electrical devices, while not experiencing the problems associated with previous methods.

SUMMARY OF THE INVENTION

To address the above-discussed deficiencies, one embodiment of the present invention provides a process for forming electrical contacts to a molecular layer. The process comprises coating a surface of a stamp with a metal layer and forming an attached layer of anchored molecules by covalently bonding first ends of the anchored molecules to one of either a conductive or semiconductive substrate or the metal layer. The process further comprise placing the other of the conductive or semiconductive substrate or the metal layer in contact with the attached layer of anchored molecules, the conductive or semiconductive substrate or the metal layer covalently bonding to free ends of the anchored molecules.

In another embodiment, the invention further provides a nanoscale electronic device, comprising a conductive or semiconductive substrate, a layer of anchored molecules and a printed metal layer. The layer of anchored molecules has first and second ends, the first ends of the molecules being covalently anchored to the conductive or semiconductive substrate, and the second ends able to rotate about the anchored first ends. The printed metal layer is covalently coupled to the second ends of the layer of anchored molecules.

Yet another embodiment of the present invention provides a method for manufacturing an integrated circuit. The method comprises forming active devices and interconnecting the devices to form an operative integrated circuit. Forming the active devices includes forming conductive electrodes on or in a substrate and forming a conductive or semiconductive layer over the conductive electrode and the substrate. A layer of molecules having first and second ends is formed by anchoring the first ends to the conductive or semiconductive substrate and wherein the second ends able to rotate about the anchored first ends. Forming the active devices further includes imprinting a gate electrode by contacting a stamp having a metal layer located thereon with the second ends of the layer of molecules to form a bond between the metal layer and the second ends.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description, when read with the accompanying FIGUREs. It is emphasized that in accordance with the standard practice in the optoelectronic industry, various features may not be drawn to scale. The dimensions of the various features may be arbitrarily increased or reduced for clarity of discussion. Reference is now made to the following descriptions taken in conjunction with the accompanying drawings, in which.

DETAILED DESCRIPTION

The present invention recognizes the advantageous use of using a nanotransfer printing procedure for forming electrical contacts to a molecular layer. The procedure for forming nanoscale patterned thin film metal layers, is disclosed in the above mentioned U.S. patent application Ser. Nos. 10/098, 202, 10/098,201 and 10/178,471, incorporated herein by reference. It has been discovered that this procedure as adapted to the present invention allows for the reliable production of nanoscale devices, which in turn may be incorporated into an integrated circuit.

Figure 1A:
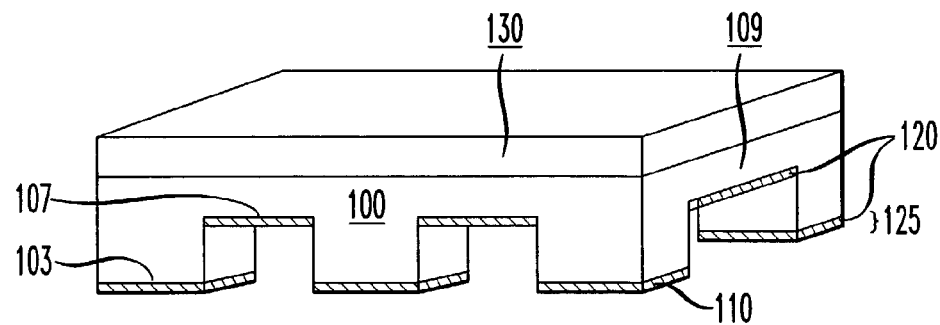
FIGS. 1A to 1D illustrate a process for forming electrical contacts to a molecular layer according to the present invention.

Referring initially to FIGS. 1A to 1D, illustrated are selected views of the process for forming electrical contacts to a molecular layer. Turning first to FIG. 1A, illustrated is a stamp 100 and the coating of a surface 110 of the stamp 100 with a metal layer 120. The process for forming the stamp 100 has been disclosed in U.S. patent application Ser. Nos. 10/098,202, 10/098,201 and 10/178,471, as incorporated above. Briefly, the process may include forming a pattern on a template, the pattern comprising raised and relief portions. The template is coated with a prepolymer and a catalytic agent, preferably with a mixture of the prepolymer and catalytic agent. The prepolymer is then cured to form an elastomeric rubber. The elastomeric rubber is peeled away from the template to form the stamp 100. At least one surface 110 of the stamp 100 comprises raised portions 103, corresponding to relief portions of the template, and relief portions 107, corresponding to raised portions of the template. In certain embodiments, to facilitate handling, the stamp 100 may be attached to a polymer substrate 130 such as poly(ethylene terephthalate), as disclosed in U.S. patent application Ser. Nos. 10/098,202, 10/098,201 and 10/178, 471.

The coating of the stamp 100 with the metal layer 120 may be conducted using any conventional process well known to those of ordinary skill in the art. For example, coating may be achieved by treating the surface 110 of the stamp 100 with a solution containing ions corresponding to the metal layer 120. Alternatively, coating may be accomplished by metal evaporation: evaporating metal vapors onto to the surface 110 of the stamp 100, using, for example, conventional thermal and electron beam evaporation techniques. In certain preferred embodiments, the coating is performed for a sufficient period to form a metal layer 120 about 200 to about 300 Angstroms thickness 125. However, thicker metal layers may be produced according to the present invention, for example, by using a hard material for fabricating the stamp 100. It is also preferable to mount the stamp 100 directly above the source so that the evaporated metal only covers the raised and recessed regions of the stamp 100, and not the sidewalls 109.

Figure 1B:
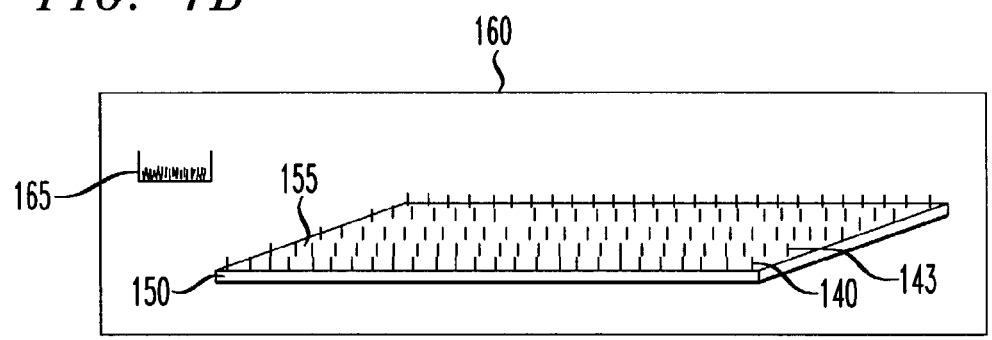

Turning to FIG. 1B illustrated is the formation of an attached layer of anchored molecules 140 by coupling first ends of the anchored molecules 143 to a conductive or semiconductive substrate 150, for example by covalent bonding. The coupling may be accomplishing using any conventional process that will result in substantially all sites on the surface 155 of the conductive or semiconductive substrate 150 being coupled to the first ends 143 of the molecule 140. For example, coupling may be achieved by placing a surface 155 of the conductive or semiconductive substrate 150 in contact with a solution containing the molecules 140. In certain embodiments, to facilitate coverage of the substrate 150, the molecules 140 may be dissolved in a solvent, such as ethanol or similar organic solvent.

In certain preferred embodiments, coupling is performed by placing the conductive or semiconductive substrate 150 in a chamber 160 and placing a source 165 of the molecules 140 in the chamber 160. One of ordinary skill in the art would understand that before the deposition of the molecules 140, the substrate may undergo surface treatments. It is preferable, for example, for a GaAs substrate to be etched prior to deposition of the molecules 140. The source 165, may be for example, a petri dish containing a sufficient amount of molecules 140 to ensure substantially complete coverage of the conductive or semiconductive substrate 150. The chamber 160 is then maintained at a temperature and pressure sufficient to allowing coupling between the first ends of the molecule 143 and the substrate 150. In certain preferred embodiments, for example, the chamber 160 is maintained at room temperature (i.e., about 23° C.), and a pressure of less than about 0.001 Torr for at least about 15 minutes.

Figure 1C:
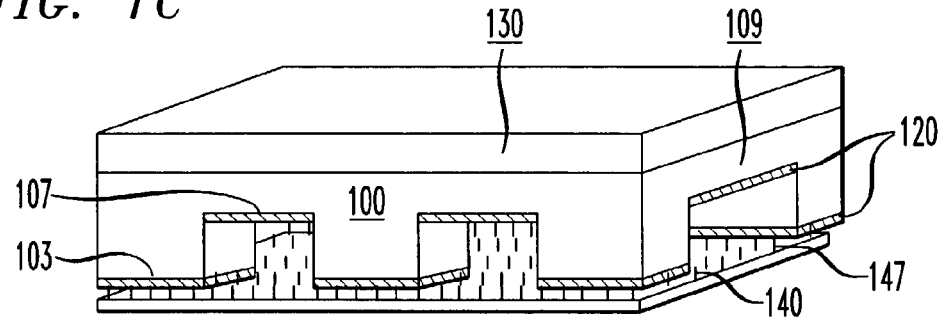

Turning to FIG. 1C illustrated is placing the metal layer 120 in contact with the attached layer of anchored molecules 140, the metal layer 120 chemically bonding to free ends of the anchored molecules 147. Chemically bonding between the free ends 147 and the metal layer 120 occurs rapidly and without further processing steps. For example, contacting the anchored layer of molecules 140 and the metal layer 120 may be done at room temperature (~23° C.) in room air. Similarly, no additional force need be applied other than the inherent contact between the stamp 100 and the substrate 150.

Contact is maintained for a period sufficient to ensure substantially complete chemical bonding of the metal layer 120 to free ends of the anchored molecules 147. In certain preferred embodiments, for example, placing the metal layer 120 in contact with the attached layer of anchored molecules 140 occurs for less than about 15 seconds, and more preferably less than about 3 seconds.

Figure 1D:
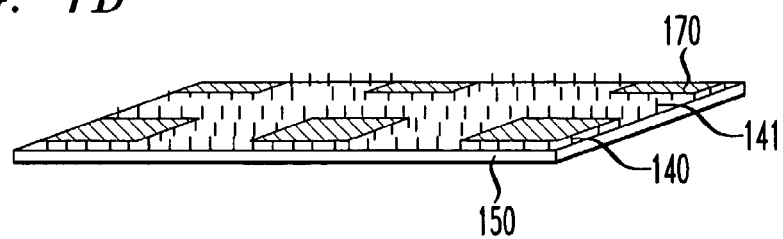

After the contact period, the stamp 100 is peeled away from the substrate 150 to yield a substrate 150 having metal layers 170 covalently bonded to the anchored molecules 140 in discrete locations corresponding to raised portions 103 on the stamp 100 (FIG. 1D).

In other preferred embodiments, the stamp 100 bearing the metal layer 110 may be placed in chamber 160, and the first ends 143 of the molecules 140 coupled to the metal layer 110. The stamp 100 bearing metal layer 110 and molecules 140 attached thereto, are then contacted to the conductive or semiconductive substrate 150. Contact is for a sufficient period to ensure complete chemical bonding of the conductive or semiconductive substrate 150 to free ends of the anchored molecules 147. After the contact period, the stamp 100 is peeled away from the substrate 150 to yield a substrate 150 having metal layers 170 covalently bonded to the anchored molecules 140 in discrete locations corresponding to raised portions 103 on the stamp 100, similar to that depicted in FIG. 1D, with the exception that there are substantially no anchored molecules 141 attached to the conductive or semiconductive substrate 150 that are also not attached to the metal 170.

Figure 2:
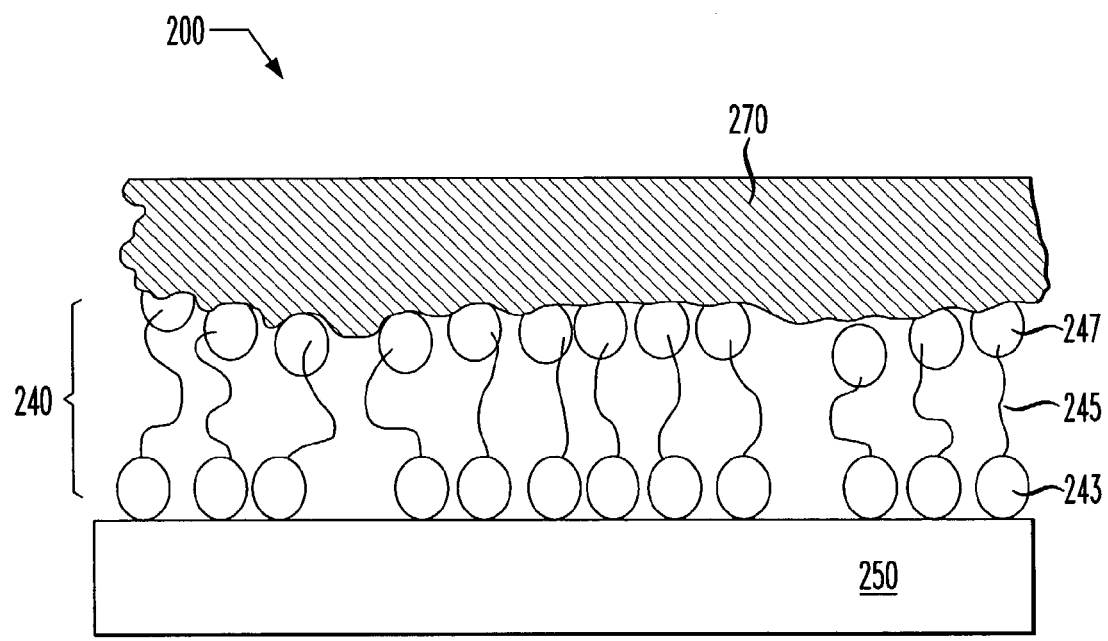
FIG. 2 illustrates components in a nanoscale electronic device of the present invention.

Another embodiment of the present invention, illustrated in FIG. 2, is a nanoscale electronic device 200. For clarity, components analogous to that shown to FIGS. 1A to 1D, retain analogous numbering. The device 200 may include a conductive or semiconductive substrate 250 and a layer of anchored molecules 240 having first 243 and second ends 247, the first ends 243 of the molecules 240 being anchored to the conductive or semiconductive substrate 250. The second ends 247 are able to rotate about the anchored first ends 243. The device 200 further includes a printed metal layer 270 coupled to the second ends 247 of the layer of anchored molecules 240, by covalent bonding, for example. The term printed metal layer 270 refers to a metal layer covalently associated with the anchored molecules and forming a substantially uniform blanket coverage over the anchored molecules 240, at discrete locations on the substrate 250, as defined by the raised pattern on the stamp 100, as discussed elsewhere herein.

The anchored molecules 240 of the device 200 may be comprised of one or more compounds characterized by the chemical formula:

F' comprises the first end 243 wherein the first end 243 comprises a first functional moiety capable of chemically bonding to the conductive or semiconductive substrate 250. F" comprises the second end 247 wherein the second end 247 comprises a second functional moiety capable of chemically bonding to the metal layer 270. R comprises a bridge 245 covalently linking the first 243 and second ends 247, where R 245 comprises individually substituted or unsubstituted nonreactive chemical groups, and $0 \leq n \leq 50$.

The first functional moieties may comprise any functional groups that would facilitate the formation of covalent bonds between the conductive or semiconductive substrate 250 and the first ends 243 of the molecule 240. In certain preferred embodiments, for example, the first functional moieties are selected from the group consisting of thiols, monocarboxylates, dicarboxylates and alkoxides. One of ordinary skill in the art would understand that the selection of first functional groups may vary according the chemical composition of the substrate 250. For example, if the substrate 250 is composed of gallium arsenide, then the first functional moieties preferably comprise thiols, monocarboxylates or dicarboxylates. Alternatively, if the substrate 250 is composed of gold, then the first functional moieties preferably comprise thiols. Or, if the substrate 250 is composed of silicon, then the first functional moieties preferably comprise alkoxides.

The second functional moieties may comprise any functional groups that would facilitate the formation of covalent bonds between the printed metal layer 270 and the second ends 247 of the molecule 240. In certain preferred embodiments, for example, the second functional moieties are selected from the group consisting of thiols and disulfides.

As noted $(R)_n$ 245, the bridge 245, may comprise any chemical composition comprising non metal atoms that covalently links the first 243 and second ends 247. In certain embodiments R may comprise nonmetals moieties such as, —$C_6H_4$—, —$CH_2$—, —NH—, or —O—, that are repeated n times. These nonmetal moieties may be unsubstituted or substituted. In certain preferred embodiments, for example, R comprises an alkane group having the chemical formula: (—$CH_2$—) or an aromatic having the chemical formula: (—$C_6H_4$—), and $1 \leq n \leq 25$. R comprising an aromatic group, such as a 4,4'biphenyl group (i.e., R=—$C_6H_4$—; n=2), or related compounds, are also within the scope of the present invention.

Various processing considerations may guide the selected of molecules 240. For example, in certain embodiments, the molecule 240 should be sufficiently volatile that when placed in chamber 160 (FIG. 1C) the molecule will enter the gas phase in sufficient concentrations to couple to and coat the entire substrate 240 within an acceptable period. In other embodiments, the molecule 240 should be a liquid or sufficiently soluble in a solvent, so as to couple to and coat the entire substrate 250 when the liquid or solution is contacted with the substrate 250.

The printed metal layer 270 may comprise any metal that can covalently couple the molecule 240 and provide an electrical contact between the device 200 and other electrical components. In certain preferred embodiments, for example, the printed metal 220 layer is selected from the group consisting of Gold, Silver, Copper, Platinum, Palladium, Tungsten, Aluminum and alloys thereof.

Likewise, the conductive or semiconductive substrate 250 may comprise any material that can covalently couple to the molecule 240 and provide an electrical contact between the device 200 and other electrical components. In certain preferred embodiments, for example, conductive or semiconductive substrate 250 is selected from the group consisting of Gallium Arsenide, Silicon, Indium Phosphide, Gold, and Tungsten Oxide. One of ordinary skill in the art would understand that certain substrates 250, such as Silicon or Gallium Arsenide, may be further contain a conventional dopant introduced using conventional techniques, to increase its conductivity.

As noted above, the printed metal layer 270 and the conductive or semiconductive substrate 250 form electrical contacts for the device 200. In certain embodiments, for example, the layer of anchored molecules 240 forms a one of a channel and a gate dielectric, the conductive or semiconductive substrate 250 forms the other of a first electrode and a channel, and the printed metal layer 250 forms a second electrode of a field effect transistor.

Yet another embodiment of the device 200 of the present invention comprises the conductive or semiconductive substrate 250 and the layer of anchored molecules 240. However, unlike the previously described embodiments, the anchored molecules 240 have a reactive end, substantially similar to the above described first end 243, and a nonreactive end, substantially similar to the above-described bridge 245. The reactive end 243 is covalently anchored to the semiconductive substrate 250, while the nonreactive end 245 is able to rotate about the reactive end 243. The device further includes a printed metal layer 270 laminated to the nonreactive ends 245 of the layer of anchored molecules 240, using conventional techniques well known to those skilled in the art, as further discussed in U.S. patent application Ser. Nos. 10/098,202, 10/098,201 and 10/178,471.

In such an embodiment of the device 200, for example, the anchored molecules 240 may comprise one or more compounds characterized by the chemical formula: F'—(R)$_n$. F' comprises the reactive end 243 where the reactive end, F' comprises a functional moiety capable of chemically bonding to the semiconductive substrate 250. The nonreactive end 245, R comprises individually substituted or unsubstituted non-reactive chemical groups and $0 \leq n \leq 50$.

As further illustrated in the experimental section to follow, devices 200 of the present invention can be efficiently fabricated with fewer defects than previously obtained from conventional devices. For example, the device 200 of the present invention may have a contact resistance between the printed metal layer 220 and the conductive or semiconductive substrate 250 that is at least about 10, more preferably 100, and even more preferably 1000 times higher than a contact resistance for a substantially identical device except having an evaporated metal layer or colloidal metal layer.

Yet another embodiment of the present invention is a method for manufacturing an integrated circuit. The method comprises forming active devices and interconnecting said devices to form an operative integrated circuit. One of ordinary skill in the art would understand that such devices could be assembled to form a variety of components in integrated circuits. Such components may include, for example, field effect transistors (FET), Metal Oxide Semiconductor Field-Effect Transistor MOSFET, Complementary Metal Oxide Semiconductor (CMOS), bipolar transistors, diodes and similar devices, and therefore the details of such assembly steps are not presented here.

Figure 3:
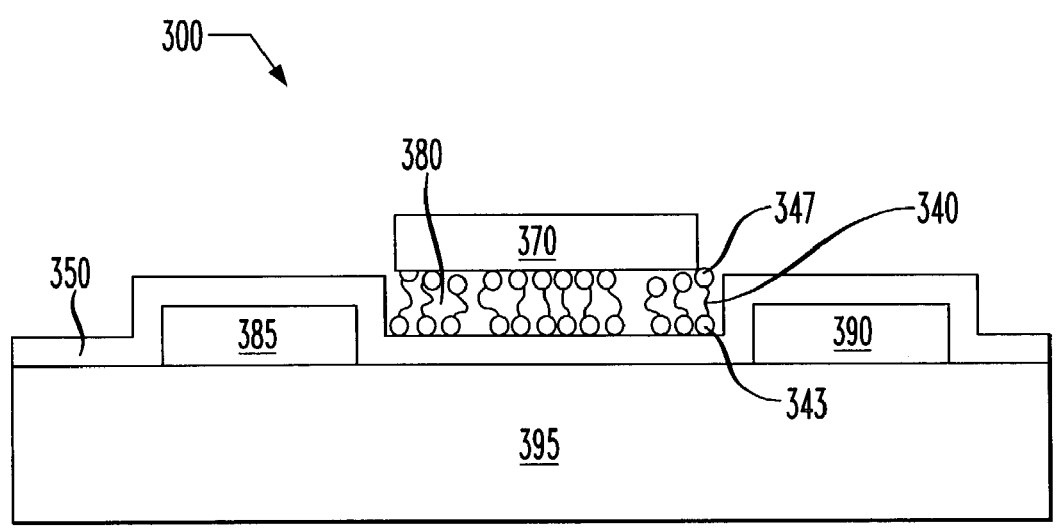
FIG. 3 illustrate, a method for forming an integrated circuit, which may form one environment where a device similar to that shown in FIG. 2, is included.

FIG. 3 illustrates a selected view of a method for forming active devices 300 in the integrated circuit. Any of the embodiments of process and devices discussed herein may be used to form the active devices 300, and then interconnecting the devices to form an operative integrated circuit. One of ordinary skill in the art would understand, that nanoscale devices 200 having a molecular layer 240 (FIG. 2) may be incorporated into devices 300 where thin internal layers of active or passive material would present an advantage. Forming the active devices 300 includes forming conductive electrodes 385, 390 (e.g., source and drain) on or in a substrate 395. A conductive or semiconductive layer 350 is formed over the conductive electrodes 385, 390 and the substrate 395. A layer of molecules 340, acting as a dielectric, is formed by covalently anchoring a layer of the molecules 340 having first and second ends, 343, 347, the first ends 343 of the molecules being anchored to the conductive or semiconductive substrate 350 and the second ends 347 able to rotate about the anchored first ends 343. Forming the device further includes imprinting an electrode 370, such as a gate electrode, by contacting a stamp 100, such as that shown in FIG. 1A, having a metal layer located thereon with the second ends 347 of the layer of molecules 340 to form a bond, for example a covalent bond, between the metal layer 370 and the second ends 347.

As noted elsewhere herein, the present invention allows for the efficient production of integrated circuits with a low number of non functioning nanoscale device components. For example, in certain embodiments, the method results in at least about 99% of nanoscale devices 200, that may be incorporated into a transistor 300, have a contact resistance between the printed metal layer 270 and the conductive or semiconductive substrate 250, comprising GaAs for example, of greater than about $1 \times 10^5$ ohm cm$^2$. In other preferred embodiments, the method results in at least about 99% of the formed nanoscale devices 200, have a contact resistance that agree within a factor of about 2 units.

Although the present invention has been described in detail, those skilled in the art should understand that they can make various changes, substitutions and alterations herein without departing from the scope of the invention.

EXPERIMENTS

A first series of experiments was conducted to examine the reliability of using a conventional contact probe to measure the electrical conduction between contacts formed in the nanoscale devices of the present invention. Nanoscale devices having different contact areas were fabricated using the processes described herein. Specifically, the conductive substrate comprised GaAs, the anchored molecules comprised 1,8 octane dithiol and the printed metal layer comprised gold.

The rubber elastomeric stamp was fabricated as described elsewhere herein and in Loo et al., using a prepolymer comprising polydimethyl siloxane and platinum catalyst (Sylgard 184 Elastomer Kit, Dow-Corning, Midland, Mich.). The stamp was coated with gold (~10 Angstrom/s) using conventional thermal evaporation using an electron beam, a pure gold target (~99.9999 wt % purity) and pressure of $10^{-7}$ Torr, at room temperature for about 20 to about 30 s.

To remove the superficial oxide layer GaAs substrates were etched with either concentrated HCl or NH$_3$OH (either at ~30 wt %) for about 2 min, rinsed with deionized water and dried, prior to forming an attached layer of anchored molecules. To attach the 1,8 octane dithiol molecules, the GaAs substrates were placed in a commercial desiccator, and about 2–3 drops of 1,8 octane dithiol was added to a petri dish located in the desiccator. A vacuum was formed in the desiccator using a house vacuum (~0.001 Torr) for about 15 minutes.

The GaAs substrate was then removed from the desiccator rinsed with ethanol and dried over nitrogen gas. After drying, the gold-layered stamp was contacted with the substrate for between about 2 and about 15 seconds. The stamp was then peel off the substrate to yield the nanoscale device. As a routine test to ensure that the gold layer was chemically bonding to free ends of the 1,8 octane dithiol, selected devices were adhered to adhesive tape (Scotch Tape®, 3M Company, St. Paul, Minn.) and the tape was examined for the absence of gold.

Figure 4:
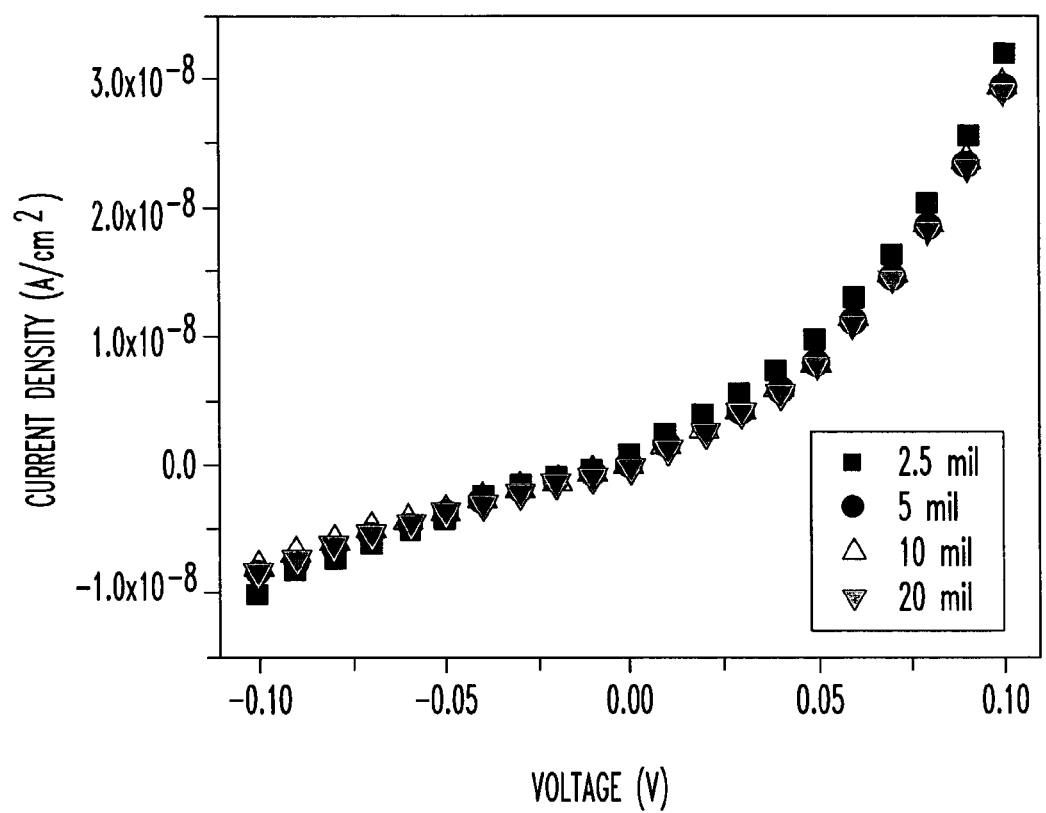
FIG. 4 illustrates the relationship between current density and voltage for devices made according to the present invention having various contact areas.

FIG. 4 illustrates selected results showing the relationship between current density and voltage for devices made according to the present invention having various contact areas. The relationship between current density and voltage was nearly the same for contact areas ranging from about 62.5 microns by 62.5 microns (i.e., 2.5 mil×2.5 mil) to about 500 microns by 500 microns (i.e., 20 mil×20 mil). This indicates that the method for measuring voltage and current across the nanoscale devices was reproducible.

Figure 5:
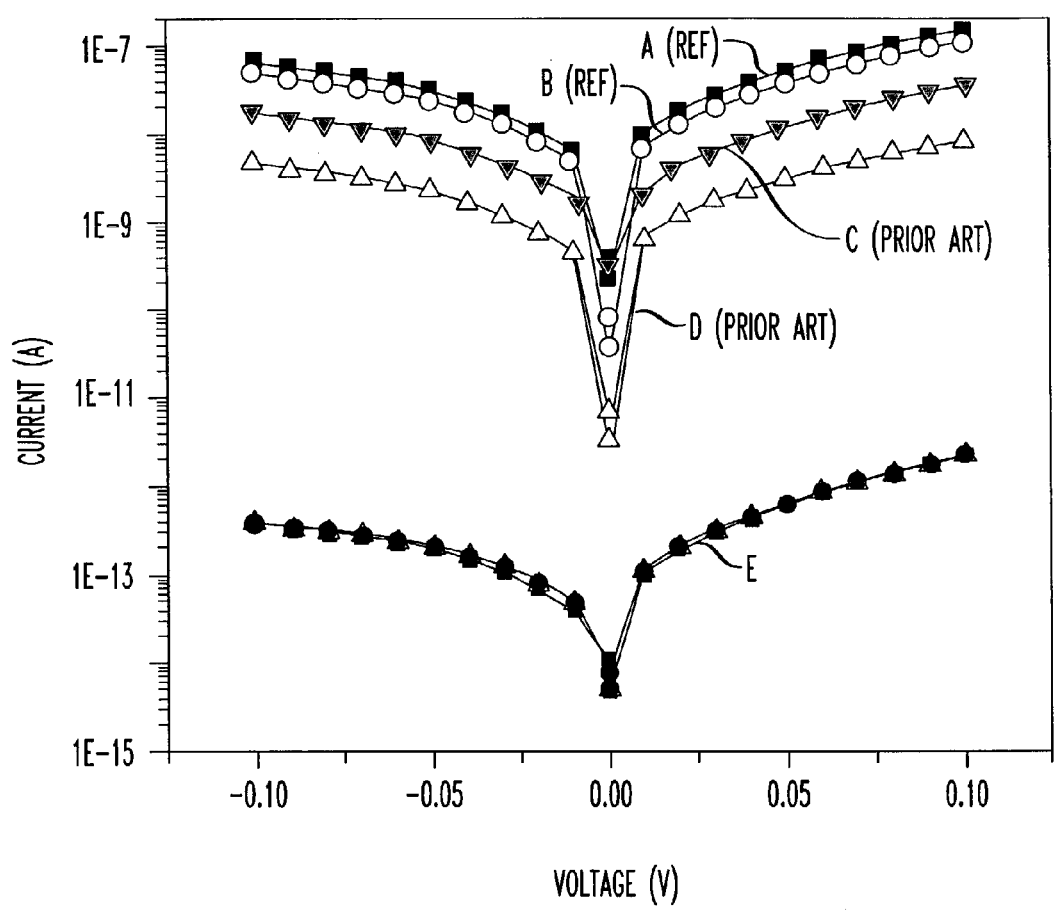
FIG. 5 illustrates selected results for: (A and B) reference devices; (C and D) conventionally made devices; or (E) devices of the present invention.

In a second series of experiments, the relationship between current and voltage was examined for a number of nanoscale devices. FIG. 5 illustrates selected results for: (A and B) reference devices (ref); (C and D) conventionally made devices (prior art); or (E) devices of the present invention. The reference devices comprised gold evaporated onto to GaAs substrates, with no intervening molecular layer. The conventionally made devices comprised substantially identical devices as the present invention except having an evaporated metal layer onto the GaAs substrate with 1,8 octane dithiol anchored thereto. The gold was evaporated onto the substrate using the same thermal evaporation methodology as described in the first experiment for coating the stamp. Evaporation was done at either: (C) room temperature (~23° C.) or (D) about −15° C. The devices of the present invention were prepared substantial the same as described in the first experiment.

FIG. 5 shows that the current passing through the conventionally made devices (C & D) was only about one order of magnitude less than the reference devices (A & B). In contrast, substantially less current (i.e., about 3 orders of magnitude) passes through the devices of the present invention (E; traced up and then down) as compared to conventionally made devices (C & D).

Contact resistance was calculated from data such as that illustrated in FIG. 5, by determining resistance from the slope of plots of current versus voltage, using data from about −0.1 V to about 0.0 V, and multiplying resistance by the area of the contact (i.e., area of GaAs and gold layer). Representative contact resistances (RA) for the devices depicted in FIG. 5 are summarized in TABLE 1. Standard deviations reported in TABLE 1 are based on the standard deviation of the slope of current versus voltage data, as determined by linear regression analysis.

TABLE 1

| Device | RA (Ohm.cm$^2$) |
|---|---|
| Reference (A) | 43.1 ± 5.2 |
| Reference (B) | 79.7 ± 8.6 |
| Conventional (C) | 140.8 ± 14.9 |
| Conventional (D) | 1166 ± 543.8 |
| Present (E) | 1.67 × 10$^7$ ± 1.06 × 10$^7$ |

As illustrated in TABLE 1, for the conventionally made devices the contact resistance between the evaporated gold layer and the GaAs substrate ranged from about 1.8 to about 27 times higher than the contact resistance of the reference devices. In contrast, the contact resistance of the present invention were at least about five orders of magnitude higher that the contact resistance of the reference device. Moreover, the contact resistance of the present devices were at least about 4 orders of magnitude higher than a contact resistance for the conventionally made devices having an evaporated metal layer.

A third series of experiments was conducted to examine the reliability of the process of the present invention to produce devices having a certain contact resistance. About 100 nanoscale devices were produced in a similar manner as described in the first experiment. A device having a substantial number of shorts is expected to have a contact resistance of less than about 1×10$^3$ ohm cm$^2$.

Figure 6:
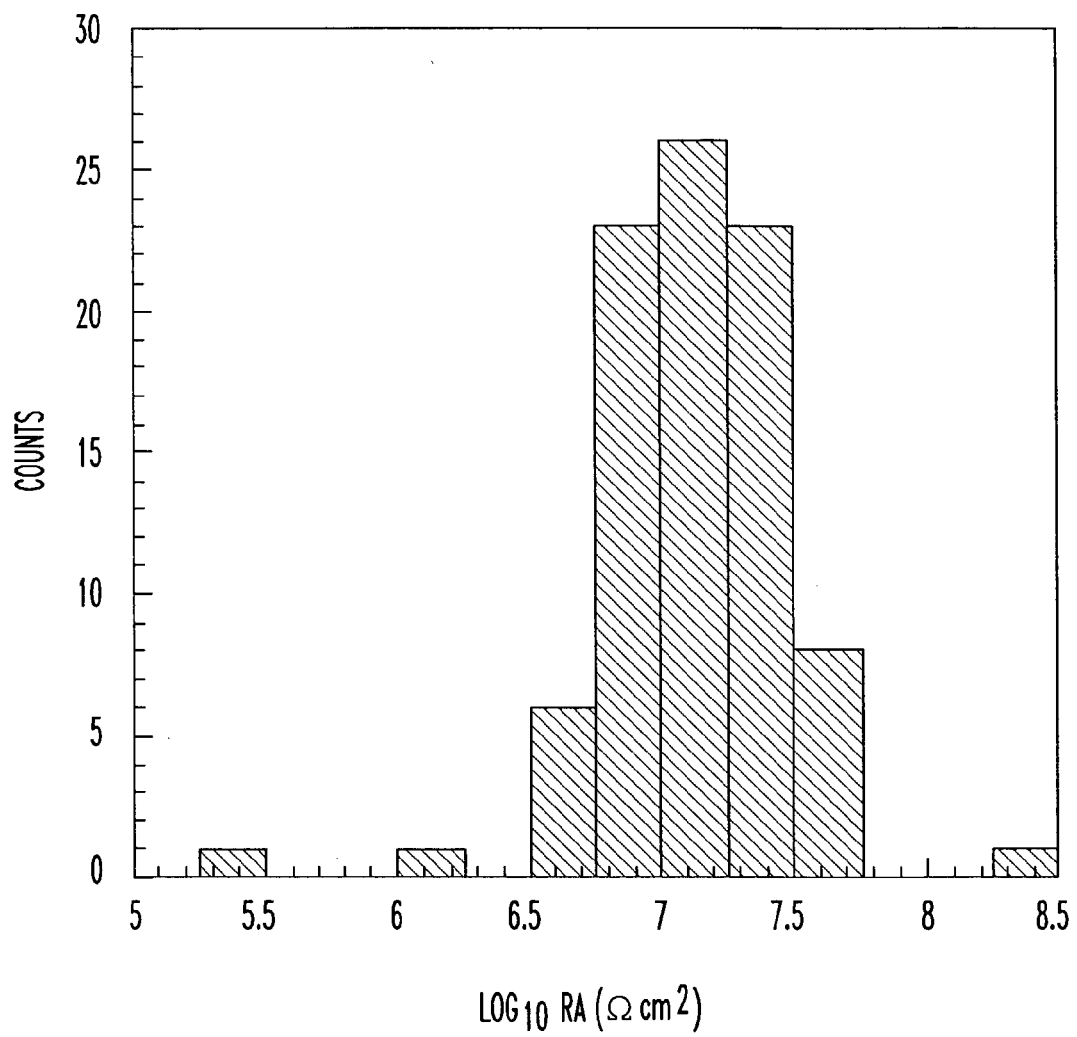
FIG. 6 illustrate the reliability of the process of the present invention to produce devices having a certain contact resistance.

FIG. 6 show the result of the experiment. Counts refers the number of devices having a Log$_{10}$(RA) value within 0.5 unit ranges depicted horizontal scale in FIG. 6. All devices tested had a contact resistance between the printed gold layer and the GaAs substrate of greater than about 1×10$^5$ ohm cm$^2$. Likewise all of the devices had a contact resistance within a factor of about 2 units.

What is claimed is:

1. A process for forming electrical contacts to a molecular layer comprising:
    coating raised and relief portions of a surface of a stamp with a metal layer;
    foaming an attached layer of anchored molecules by covalently bonding first ends of said anchored molecules to one of either a conductive or semiconductive substrate or said metal layer; and
    placing the other of said conductive or semiconductive substrate or said metal layer in contact with said attached layer of anchored molecules, said conductive or semiconductive substrate or said metal layer covalently bonding to free ends of said anchored molecules.

2. The process as recited in claim 1, further comprising forming said stamp by:
    forming a pattern on a template, said pattern comprising raised portions that correspond to said relief portions of said surface;
    coating said patterned template with a mixture of a prepolymer and a catalytic agent;
    curing said prepolymer to foam a elastomeric rubber; and
    peeling said elastomeric rubber away from said template.

3. The process as recited in claim 1, wherein said coating is performed for a sufficient period to form said metal layer with a thickness of about 200 to about 300 Angstroms.

4. The process as recited in claim 1, wherein said coating process includes
    treatment with a metal solulion.

5. The process as recited in claim 1, wherein said covalent bonding comprises:
    placing said conductive or semiconductive substrate in a chamber;
    placing said molecules in said chamber; and
    maintaining said chamber at a temperature of about 23° C. and a pressure of less than about 0.001 Torr for at least about 15 minutes.

6. The process as recited in claim 1, wherein said covalent bonding comprises placing said conductive or semiconductive substrate in a solution containing said molecules.

7. The process of claim 1, wherein said first ends or said free ends comprise thiol functional groups.

8. A method for manufacturing an integrated circuit, comprising: forming active devices, including:
    forming conductive electrodes on or in a substrate;
    forming a conductive or semiconductive layer over said conductive electrode and said substrate;
    forming a layer of molecules having first and second ends by anchoring said first ends to said conductive or semiconductive substrate wherein said second ends are capable of rotation about said anchored first ends; and
    imprinting a gate electrode by contacting raised portions of a surface of a stamp having a metal layer located thereon with said second ends of said layer of molecules to form a bond between said metal layer and said second ends; and
    interconnecting said active devices to form an operative integrated circuit.

9. The method as recited in claim 8, wherein said anchoring comprises:
    placing said conductive or semiconductive substrate in a chamber;
    placing said molecules in said chamber; and maintaining said chamber at a temperature of about 23° C. and a pressure of less than about 0.001 Torr for at least about 15 minutes.

10. The method as recited in claim 8, wherein said contacting occurs for less than about 15 seconds at about 23° C.

11. The method as recited in claim 8, wherein said formed transistors have a contact resistance between said printed metal layer and said conductive or semiconductive substrate of greater than about $1 \times 10^5$ ohm cm$^2$.

12. The method as recited in claim 8, wherein said formed transistors have a contact resistance within a factor of about 2 units.

13. The process as recited in claim 1, wherein said coating process includes metal evaporation.

14. The process as recited in claim 1, wherein said stamp comprises an elastomeric rubber.

* * * * *